United States Patent
Chen et al.

[19]

[11] Patent Number: 5,862,146
[45] Date of Patent: Jan. 19, 1999

[54] PROCESS OF TESTING MEMORY PARTS AND EQUIPMENT FOR CONDUCTING THE TESTING

[75] Inventors: Teck Liong Chen; Choon Poh Looi; Fock San Ho; Kok Lay Lim, all of Singapore, Singapore

[73] Assignee: Texas Instruments Incorporated, Dallas, Tex.

[21] Appl. No.: 838,112

[22] Filed: Apr. 15, 1997

[51] Int. Cl.$^6$ .................................................. G11C 29/00
[52] U.S. Cl. .......................................................... 371/21.1
[58] Field of Search ................................ 371/21.1, 22.1, 371/22.2, 22.5, 22.6; 365/201

[56] References Cited

U.S. PATENT DOCUMENTS 4,686,456  8/1987  Furuyama et al. ..................... 371/21.5
5,365,165  11/1994  El-Ayat et al. ......................... 371/22.2
5,579,272  11/1996  Uchida .................................... 365/201
5,717,643  2/1998  Iwanami et al. ........................ 365/201

*Primary Examiner*—Trinh L. Tu
*Attorney, Agent, or Firm*—Lawrence J. Bassuk; Richard L. Donaldson

[57] ABSTRACT

A process and apparatus for testing wide word memory parts (618–624), sixteen data I/O leads per part, uses two stages of relays (610, 612 and 614) to connect the memory parts to sixteen test receivers (Ra, Rb, Rc and Rd). When the memory parts are in a normal operating mode or non-DFT mode, the relays connect all sixteen data I/O leads of each memory part to the sixteen test receivers, one memory part at a time. When the memory parts are in the DFT mode, the relays connect all the active DFT data I/O leads (0–3) to the receivers. A test performance board can carry one or more modules of memory parts with each module containing plural sockets for retaining the memory parts and one or more stages of relays.

9 Claims, 8 Drawing Sheets

PROCESS OF TESTING MEMORY PARTS AND EQUIPMENT FOR CONDUCTING THE TESTING

FIELD OF THE INVENTION

This invention relates generally to testing memory parts and particularly relates to testing dynamic random access memory DRAM parts having wide word input and output of data, typically of sixteen bit in a data word and greater.

DESCRIPTION OF THE RELATED ART

Manufacture of DRAM and other memory parts includes design of electronic circuits, fabrication and processing of silicon wafers, packaging individual chips and testing the parts. Testing presents a major part of manufacturing integrated circuits generally and memory parts particularly; the parts must be tested to insure reliability for many years. Testing memory parts consumes a lot of time in the manufacturing process because of the large arrays of memory cells on each part. Commercially available DRAMs typically have over four million storage locations or memory cells in a part and designs exist for parts having 256 million memory cells in a part. Insuring reliability requires testing each memory cell several times at multiple test points along the manufacturing process.

Previously DRAM parts had either one or four data input and output (I/O) leads for writing and reading data. These parts were referred to as being "by 1, x1" or "by 4, x4", with the number referring to the number of data I/O leads. Some parts had more data I/O leads, but they were of small volume and not a large part of the market.

Recently wide word DRAM parts having sixteen data I/O leads in a part have become a major part of the market. The phrase "wide word" comes from computer terminology and refers to the relative number of data bits that occur in a data word. Thus, sixteen data bits being read from and written to a DRAM at one time is much wider than four data bits at one time. The same increase in data I/O leads also has occurred in other memory parts such as static and non-volatile memory parts.

In production testing, each I/O lead must be connected to a receiver on a test head of a test machine. The test head receiver supplies data signals and interprets the data signals output from the data lead to which it is connected and determines whether a pass or a fail has occurred. With DRAM parts having sixteen I/O leads, sixteen receivers are required to test a single DRAM part. A major problem is that test machines have limited numbers of receivers. Existing machines can perform the required testing, but with low throughput. In order to increase capacity, more machines must be purchased. Additional receivers typically are not added to existing machines. Testing wide word DRAM parts with existing arrangements of the test machines thus requires buying additional test machines or systems to increase capacitiy or the numbers of available receivers to provide one receiver for each data I/O lead. This increases the cost of testing and increases the cost of making wide word DRAM parts.

Some reductions in test costs have been realized by designing circuits into the DRAM parts to facilitate testing. These circuits have been referred to as DFT or design for test circuits. The DFT circuits operate by conducting some or much of the testing in parallel inside the DRAM part with test results occurring on fewer than all of the data I/O leads. DFT testing occurs by placing the DRAM parts in a special DFT mode effected by applying nonstandard or over- voltages on certain leads of the DRAM part. On present sixteen data lead I/O DRAM parts, DFT results occur on four, two or one of the sixteen data I/O leads.

Any solution to this problem of needing increased test receivers should also account for the time needed to mount the DRAM parts into test sockets on test performance boards. Preferably the DRAM parts are mounted in sockets once for each desired test step. Any solution should also maintain the present process sequences of performing both DFT mode and standard operating mode (or non-DFT mode testing) at the same steps or positions in the present process flow.

SUMMARY OF THE INVENTION

In accordance with the claimed inventions, test performance boards carrying the memory parts in sockets on the test machines provide relays selectively connecting the test machine receivers to the data I/O leads of the DRAM parts. Through selective opening and closing of the relays, all of the active DFT mode data I/O leads of the DRAM parts can be connected to the receivers at the same time to perform the DFT tests on all of the parts at the same time. All of the data I/O leads of each DRAM part then can be selectively and sequentially connected to the receivers to perform the non-DFT tests on all of the parts in sequence.

With one insertion of the parts into the sockets of the test performance boards, the DRAM parts thus can be tested both in DFT mode and standard operating or non-DFT mode. This testing occurs with fewer receivers and without a need to multiply the number of receivers needed in each test machine.

A surprising aspect of the invention is the use of old technology, in the form of reed relays, selectively to connect leading edge technology memory parts to test equipment. The relays perform satisfactorily and inexpensively to solve a problem that otherwise would require multiples of expensive test equipment. The relays need to switch only between test routines, and during a test routine the relays need only to conduct electrical signals between the memory parts or devices under test and the test head receivers.

BRIEF DESCRIPTION OF THE DRAWING FIGURES

DETAILED DESCRIPTION

Figure 1:
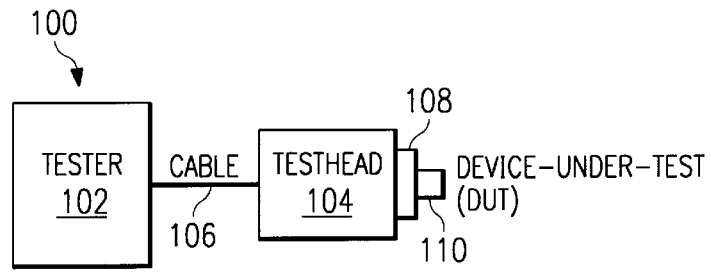
FIG. 1 is a block diagram of a test machine.

A typical processing flow for memory products starts with a wafer of silicon. The wafer is then processed with masks and dopants to form the desired circuits in and on the silicon wafers. The first of the automatic tests operations is then performed. The number of automatic test operations can be selected as desired depending upon the memory parts being tested and the testing desired. Each test operation involves as many steps as desired. For example, a test operation could include five separate steps for such as: 1. parameters, continuity, shorts and leakage; 2. a gross test in DFT mode; 3. a gross test in standard operating or non-DFT mode; 4. a speed test in non-DFT mode; and 5. a test for total electrical current in non-DFT mode.

The wafers are then burned-in and run through two additional test operations that could be different in environmental temperature, each performing a permutation of test conditions to ensure good coverage to the device data-sheet and ensure reliability in the field. The parts are then marked, packed and shipped.

Testing the memory parts preferably would occur in DFT mode exclusively so that testing can occur more quickly, but practically this cannot be done for several reasons. First there is a miscorrelation between the DFT and non-DFT modes where for example, a device fails in a non-DFT mode but passes in a DFT mode. Specific functions such as CBR, hidden refresh and self-refresh cannot be done in DFT mode.

There is a speed degradation during operation in DFT mode. Parametric testing need to be done in DC mode on all the leads and has no relation to DFT whatsoever. Measuring the electrical current needs to occur in the non-DFT mode to obtain the true current for the part. The gross test done in DFT mode basically covers a large portion of the total test time so it is still beneficial to perform the test in the DFT mode. Because the tradeoffs between the DFT and non-DFT mode tests, these two types of testing coexist at all test points.

One way of achieving high parallelism without the use of the present invention would be to build two sets of test performance boards, one set for the DFT mode tests and one set for the non-DFT mode tests. The memory parts would then be loaded onto the first DFT mode boards and tested with a high degree of test parallelism. The memory parts would then be removed from the first set of boards and loaded on the second set of boards to handle the non-DFT testing at a very low test parallelism.

Several draw backs exist for this two test performance board test scheme. The first complication occurs in needing to change the test flow of the parts so that all of the parts are tested in DFT mode first and then tested in non-DFT mode. This also causes more processing and handling of the parts due to loading and unloading the memory parts on two sets of test performance boards at each testing operation in the manufacturing process. Furthermore two sets of test machines, test performance boards and parts handlers need to be arranged for each test operation in the manufacturing flow to perform the two sets of testing. All this would lead to increased cost in time and test equipment.

In FIG. 1, test system or machine 100 comprises tester 102 and testhead 104 connected by cable 106. Testhead 104 carries a test performance board 108 in turn carrying memory parts 110 representing devices under test (DUT). Testhead 104 contains multiple receivers connected to the data I/O leads of memory parts 110, with each receiver being connected to one data I/O lead.

Figure 2:
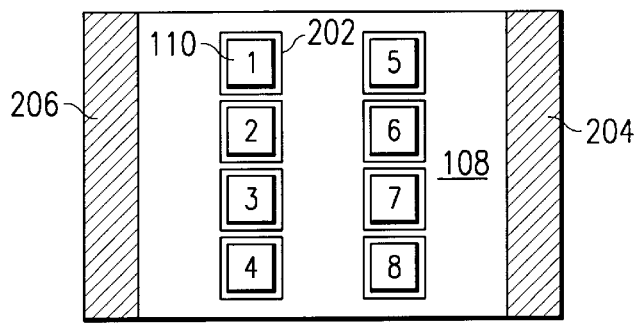
FIG. 2 is an idealized plan view of a test performance board.

In FIG. 2, test performance board 108 carries eight memory parts 110 inserted in sockets 202 by automatic and mechanical insertion equipment. Board 108 also comprises interface areas 204 and 206 carrying connections between the memory parts and sockets and the receivers of the testheads 104.

Figure 3:
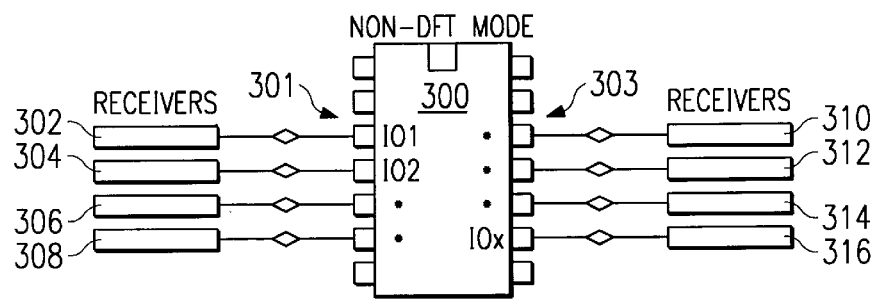
FIG. 3 is a block diagram of a memory part connected to test head receivers in a standard operating or non-DFT mode.

In FIG. 3, memory part 300 has leads 301, 303 connected to receivers 302–316. In this arrangement, the memory part is in a standard operating or non-DFT mode in which all of the I/O (also IO) leads IO1, IO2 . . . IOx are active and connected to respective ones of the receivers 302–316. Thus FIG. 3 depicts the required connections between data I/O leads of a memory part and testhead receivers for testing the memory part 300 in a standard operating or non-DFT mode.

Figure 4:
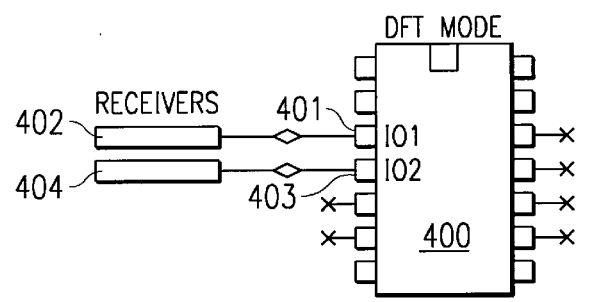
FIG. 4 is a block diagram of a memory part connected to test head receivers in a DFT mode.

In FIG. 4, memory part 400 can be of a like configuration to the memory part 300, with all of the same leads being assigned as data I/O leads. Memory part 400 however is placed in a DFT mode for testing in which only two data I/O leads 401, 403 are active, these being IO1 and IO2. The rest of the data I/O leads are indicted to be inactive by a letter "x". FIG. 4 schematically depicts data lead IO1 connected to receiver 402 and data lead IO2 schematically connected to receiver 404.

Figure 5:
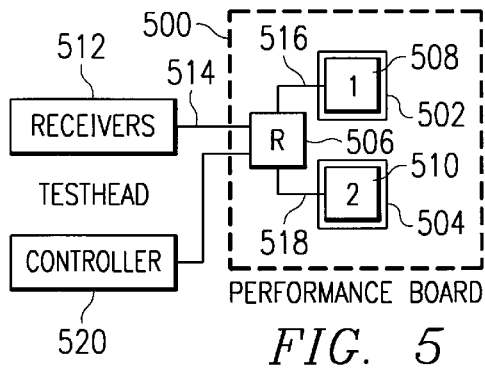
FIG. 5 is a block diagram of a single stage of relays on a test performance board selectively connecting two memory parts to test head receivers.

In FIG. 5, test performance board 500 carries two sockets 502 and 504 and a set of relays 506 arranged in a single stage. Each of sockets 502 and 504 contain or can contain respective memory part 508 and 510. Relays 506 are constructed and arranged selectively to connect the data I/O leads of the memory parts in sockets 502 and 504 to individual ones of receivers 512 over leads 514. Leads 516 extend between socket 502 and set of relays 506 and leads 518 extend between socket 504 and set of relays 506. Each of the relays in set of relays 506 can have a normal position in which they connect the memory part 508 and socket 502 to the receivers 512.

In the arrangement of FIG. 5, and referring back to FIGS. 3 and 4, the set of relays can be actuated to connect all of the data I/O leads of memory part 508 to the receivers 512 at one time for conducting standard operating or non-DFT mode testing of that memory part. The relays also can switch to connect all of the data I/O leads of memory part 510 to the receivers 512 for standard operating or non-DFT mode testing of that memory part. Further and without removing the memory parts from their sockets, the set of relays 506 can be actuated to connect only the active data I/O leads of both memory parts 508 and 510, of which there are a lesser number, to the receivers 512. In this configuration, both memory parts 508 and 510 can be tested in the DFT mode in parallel.

Thus both memory parts can be tested in sequence in the non-DFT mode and processed in parallel in the DFT mode. With a fixed number of receivers, the two memory parts 508 and 510 can be tested in both DFT and non-DFT modes with one insertion of the memory parts into sockets on the test performance board. Controller 520 controls the operation set of relays 506 in connecting the memory parts 508 and 510 to the receivers 512. Controller 520 can be any control device desired and can be under program control of the test system or machine.

Figure 6:
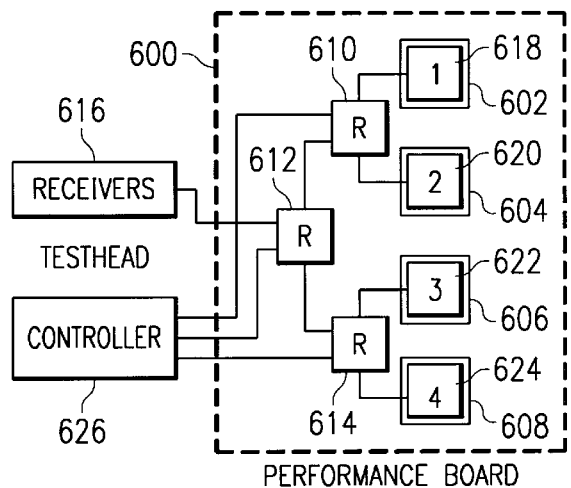
FIG. 6 is a block diagram of two stages of relays on a test performance board selectively connecting four memory parts to test head receivers.

In FIG. 6, test performance board 600 carries four test sockets 602, 604, 606 and 608. Board 600 also carries three sets of relays 610, 612 and 614 arranged in two stages. The sets of relays 610, 612 and 614 selectively connect the leads of sockets 602, 604, 606 and 608 to individual receivers 616. Each of the sockets 602, 604, 606 and 608 contain memory parts 618, 620, 622 and 624. Sets of relays 610 and 614 form a first stage and sets of relays 612 form a second stage. The relays can be selectively actuated by a controller such as controller 626 to connect selected data I/O lines of each of the memory parts to individual receivers 616.

Thus in a manner similar to that of FIG. 5, each of memory parts 618, 620, 622 and 624 can have all of their data I/O leads sequentially connected to the receivers 616. Also in a manner similar to that described in connection with FIG. 5, all of the active data I/O leads in the DFT mode for these four memory parts can be connected in parallel to receivers 616 through the sets of relays 610, 612 and 614. This again provides for both DFT and non-DFT modes of testing of these four memory parts with one mechanical insertion of the memory parts into the sockets of the test performance board. This increased testability of the parts occurs through test performance boards carrying the two stages of relays selectively connecting the data I/O leads of the memory parts to the receivers.

The sets of relays introduce minimal noise or signal distortion that can be compensated by means of software adjustments in the memory tester 102. Thus by changing the construction and arrangement of the test performance boards 600 to include the relay selections, increased test efficiency results.

Figure 7:
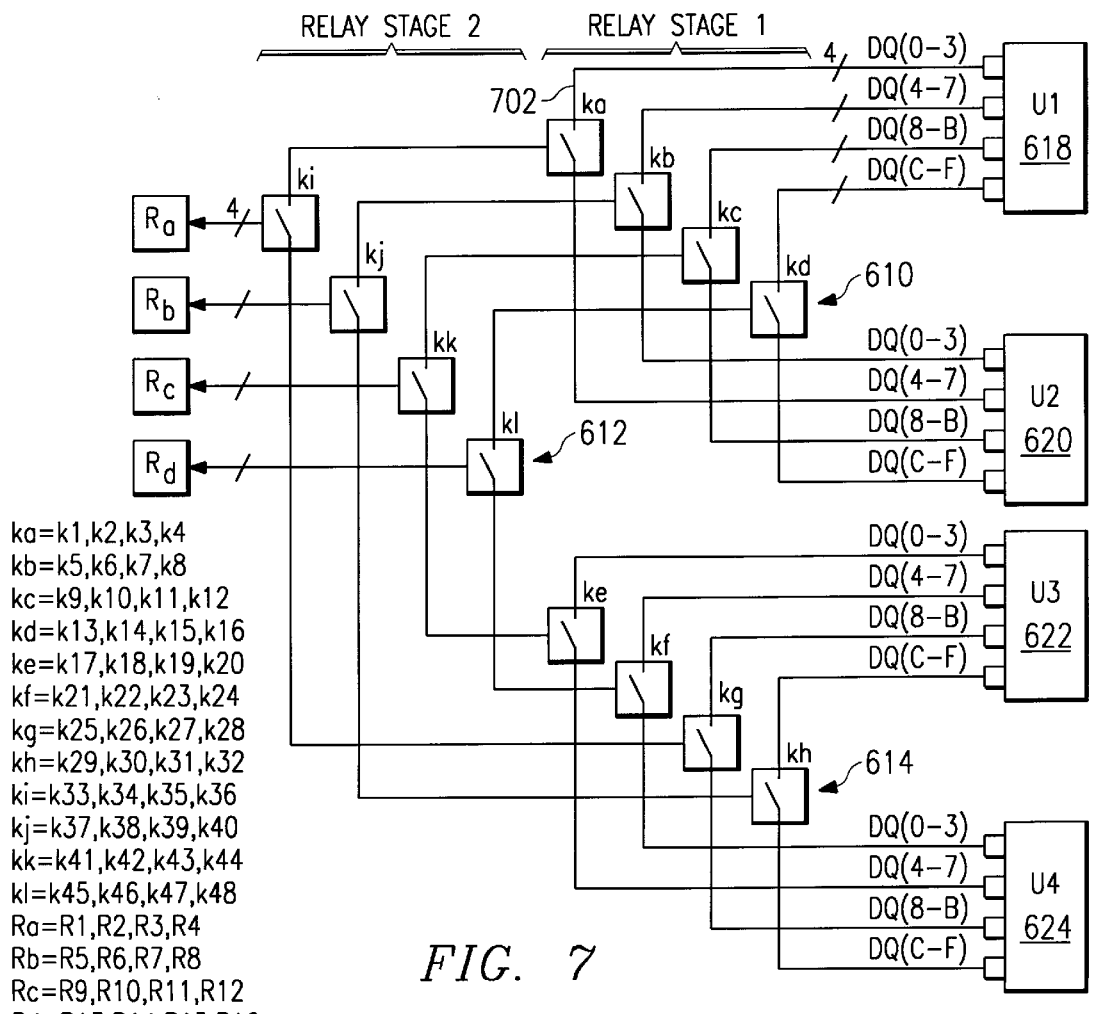
FIG. 7 is a further schematic explanation of the two stage relay connection of memory parts and receivers of FIG. 6.

In FIG. 7, set of relays 610 comprises four sets of relays a, b, c and d. Set of relays 612 comprises four sets of relays ki, kj, kk and kl. Set of relays 614 comprises four sets of relays ke, kf, kg and kh. In turn FIG. 7 identifies that each of set of relays ka–kl comprises four relays identified respectively as k1–k48. The four relays in set of relays ka connect to data I/O leads DQ(0–3) of memory part 618 and data I/O leads DQ(4–7) of memory part 620. Thus each of individual relays k1–k4 connect to an individual data I/O lead of memory part 618 and 620. This will be the same for all the rest of the relays in set of relays 610 and 614.

Set of relays kb connect to the data I/O leads DQ(4–7) of memory part 618 and the data I/O leads DQ(0–3) of memory part 620. The set of relays kc connect to data I/O leads DQ(8–B) of memory part 618 and to the data I/O leads DQ(8–B). of memory part 620. The four relays in set of relays kd connect to the respective data I/O leads DQ(C–F) of memory part 618 and to the data I/O lines DQ(C–F) of memory part 620. In a like manner each of the four relays in sets of relays ke, kf, kg and kh connect to the data I/O leads of memory parts 622 and 624. Thus each line, such as line 702, extending between memory devices 618, 620, 622 and 624 and the sets of relays ka–kh represent four individual I/O leads connected to separate data I/O leads on the memory parts.

In set of relays 612, set of relays ki connect the common terminals of relays ka and relays kg to receivers Ra. Receivers Ra comprise four receivers R1, R2, R3 and R4. Set of relays kj connect the common terminals of sets of relays kb and kh to receivers Rb. Receivers Rb comprise receivers R5, R6, R7 and R8. Set of relays kk connect the common terminals of relays kc and ke to receivers Rc. Receivers Rc comprise receivers R9, R10, R11 and R12. Relays kl connect the common terminals of relays kd and kf to receivers Rd. Receivers Rd comprise receivers R13, R14, R15 and R16.

Assume that in the DFT mode the active data I/O leads for each of memory parts 618, 620, 622 and 624 are data I/O leads DQ(0–3). Then to perform DFT mode testing on all four memory parts in parallel or at the same time, the data I/O lines DQ(0–3) of memory part 618 are connected by relays ka and ki to receivers Ra. The data I/O leads DQ(0–3) for memory part 620 are connected by relays kb and kj to receivers Rb. Data I/O leads DQ(0–3) of memory part 622 are connected by relays ke and kk to receivers Rc. Data I/O leads DQ(0–3) of memory part 624 are connected by relays kf and kl to receivers Rd. Thus all four memory parts can be tested in parallel in the DFT mode by the sixteen receivers numbered R1–R16.

By changing the settings of the relays, all of the data I/O lines, DQ(0–F) of each memory part can individually be connected to receivers R1–R16 for testing each memory part in a non-DFT mode or a standard operating mode. The four memory parts 618, 620, 622 and 624 are tested one at a time and in sequence in the non-DFT mode.

Figure 8:
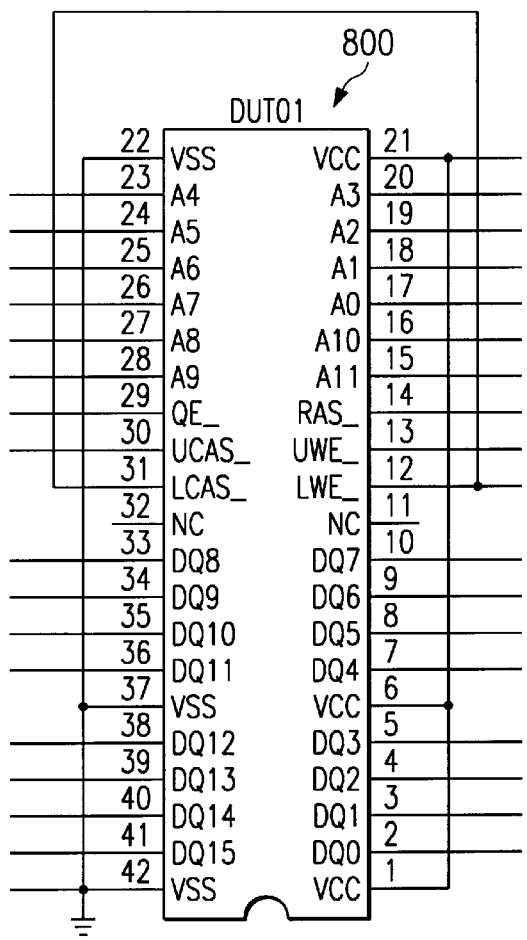
FIG. 8 is a diagram of a DRAM part having sixteen data I/O leads.

In FIG. 8, memory part 800 or device under test DUT01 has forty-two leads or pins designated to carry the particular signals identified within the outline of the package. The signals include addresses A0–A11, data I/O leads DQ0–DQ15, voltages Vcc and Vss and control signals RAS_, UWE_, LWE_, OE_, UCAS_ And LCAS_.

Figure 9:
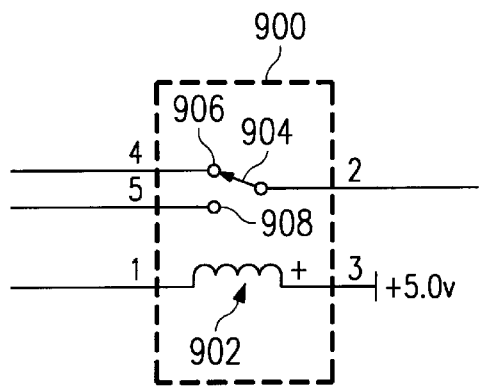
FIG. 9 is a schematic diagram of a relay used in the invention.

In FIG. 9, relay 900 has five terminals numbered 1–5, an internal magnetic coil 902, and armature 904 that is moved by any magnetic field generated by coil 902 to engage with and conduct electrical signals between common terminal 2 and either terminal 906 connected with terminal 4 or terminal 908 connected with terminal 5. Thus the absence of a five volt voltage applied across terminals 1 and 3 of relay 900 leaves armature 904 conducting electrical signals between terminals 2 and 4. The presence of a 5 volt voltage applied across terminals 1 and 3 of relay 900 swings armature 904 into conducting electrical signals between terminals 2 and 5. With a simple absence or application of five volts to the relay 900, common terminal 2 switches between signals applied to terminals 4 and 5. This substantively represents the operation of all the relays k1–k48 used to switch data I/O leads of memory parts to selected receivers.

Figure 10A:
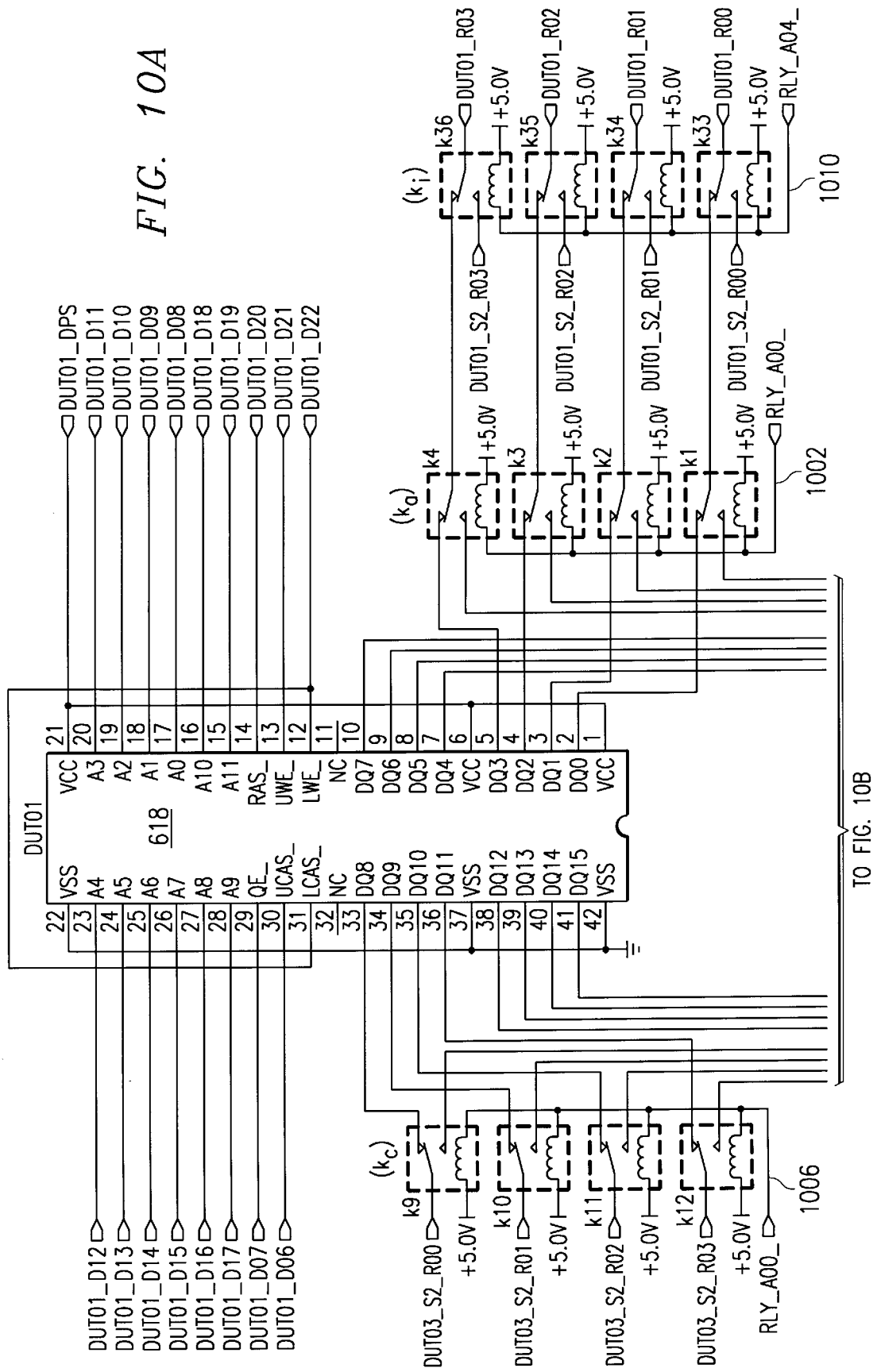
FIG. 10 is a circuit diagram of the wiring connections for the top two memory parts of FIGS. 6 and 7.
Figure 10B:
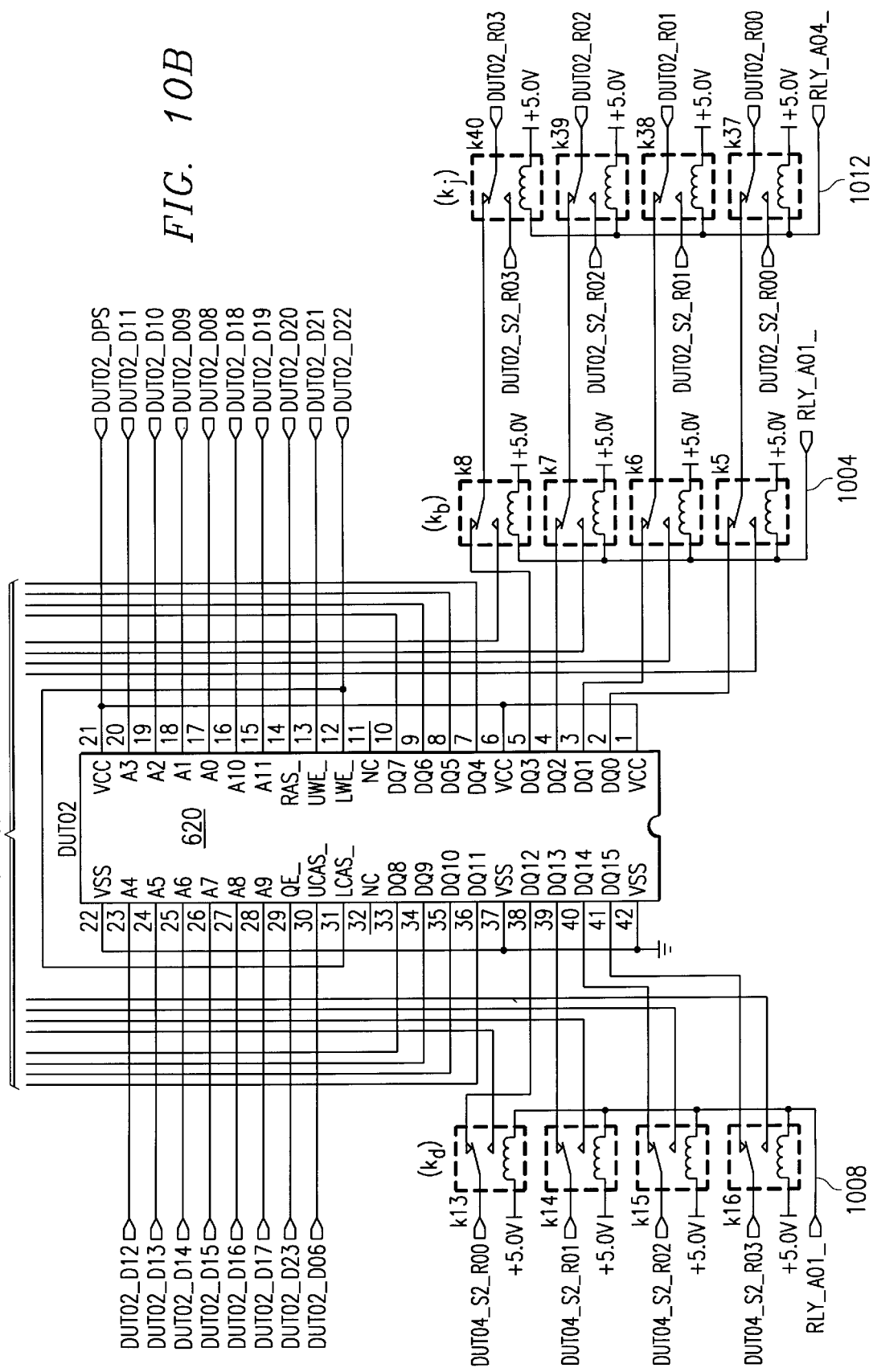
Figure 11A:
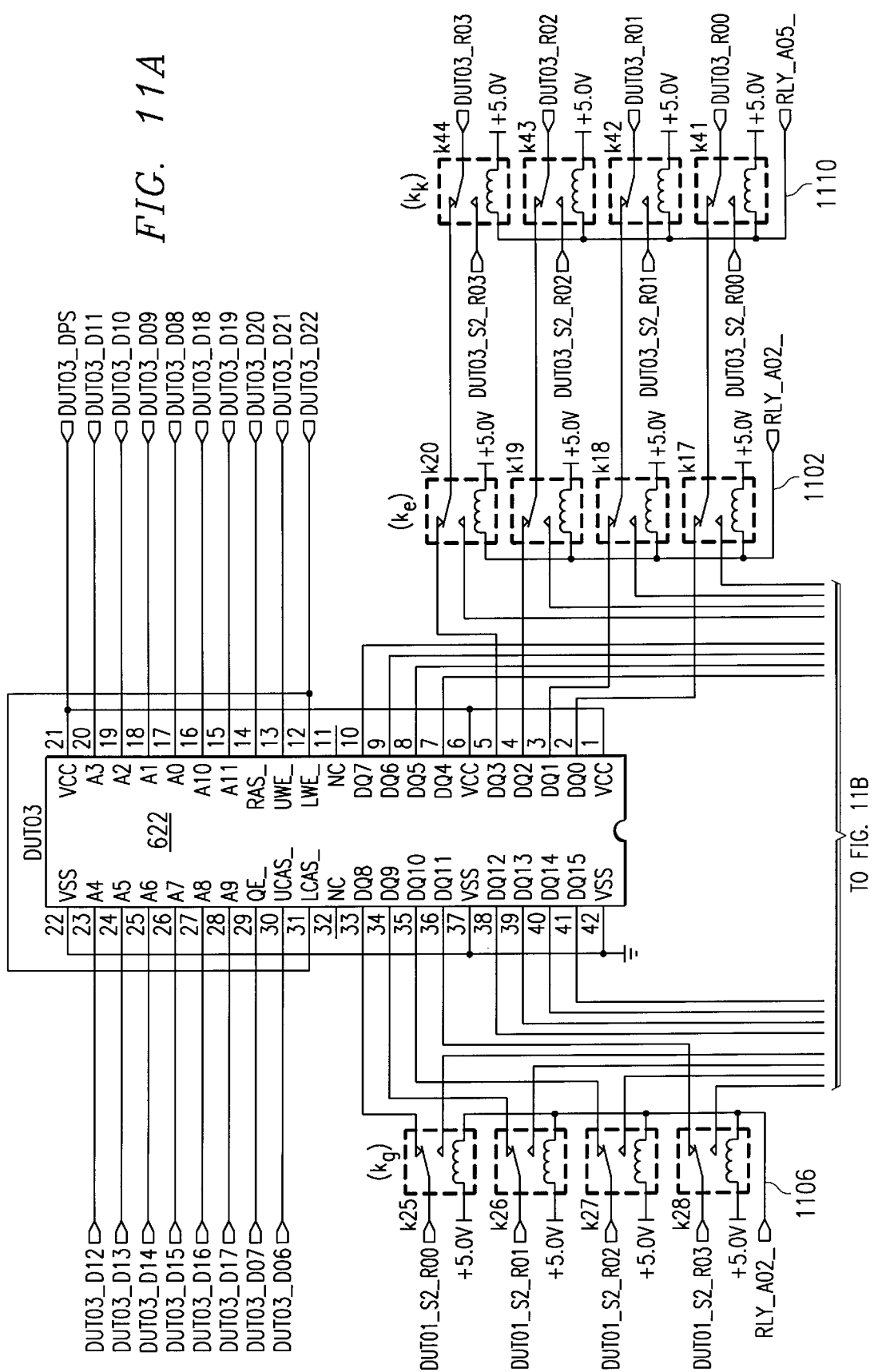
FIG. 11 is a circuit diagram of the wiring connections for the bottom two memory parts of FIGS. 6 and 7.
Figure 11B:
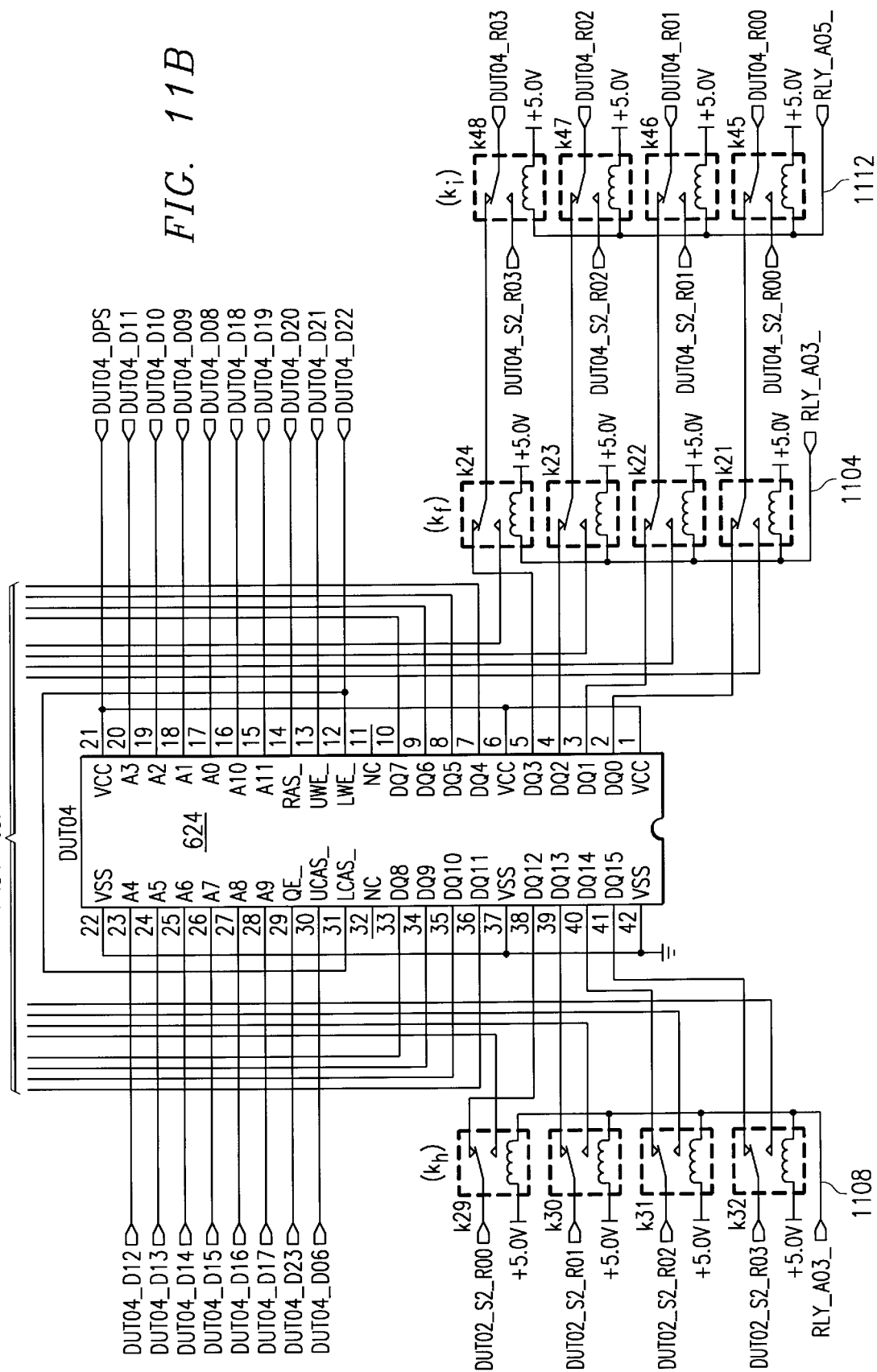

In FIGS. 10 and 11, memory parts 618, 620, 622 and 624 have their data I/O lines connecting to relays in accordance with the scheme of FIG. 7. Addresses are applied to all of the devices under test at the same time and data is written to or read from the devices under test selected by the relays.

In FIG. 10, lead 1002 connects to bank of relays ka selectively carries a five volt voltage used to switch the relays between data I/O leads. In a like manner, each of leads 1004, 1006, 1008, 1010 and 1012 selectively carry five volts to switch the respective banks of relays kb, kc, kd, ki and kj between the applied data I/O lines. Banks of relays ki and kj connect to terminals 1020 and 1022 formed on the substrate of the test performance board assembly. These terminals electrically interconnect with mating terminals in the test machine to convey electrical signals to the test head receivers.

In FIG. 11, leads 1102, 1104, 1106, 1108, 1110 and 1112 each respectively carry five volts to switch the respective banks of relays ke, kf, kg, kh, kk and kl between the respective data I/O leads. Banks of relays kk and kl connect to terminals 1120 and 1122 formed on the substrate of the test performance board assembly. These terminals electrically interconnect with mating terminals in the test machine to convey electrical signals to the test head receivers. FIGS. 10 and 11 form the wiring diagram for the arrangement of memory parts and relays depicted in FIG. 7.

Figure 12:
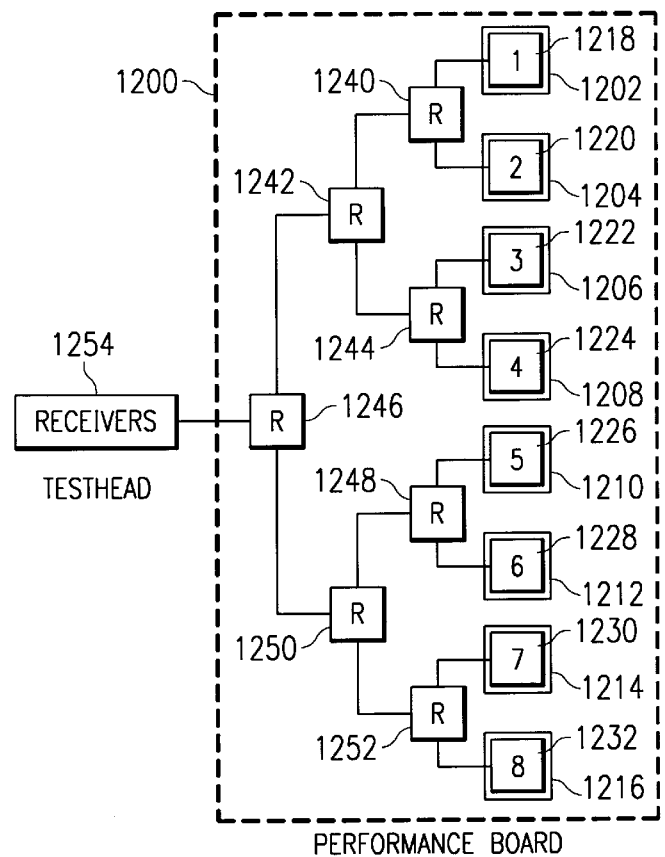
FIG. 12 is a block diagram of three stages of relays on a test performance board selectively connecting eight memory parts to test head receivers.

In FIG. 12, performance board 1200 carries a three stage relay connection of memory parts to receivers. Test performance board 1200 carries eight sockets 1202–1216 each containing a memory part 1218 through 1232. Test performance board 1200 also carries seven sets of relays 1240–1252. Sets of relays 1240, 1244, 1248 and 1252 form a first stage of relays. Sets of relays 1242 and 1250 form a second stage of relays. Set of relays 1246 form a third stage of relays and connect the data I/O leads carried on test performance board 1200 to the receivers 1254.

In this arrangement, receivers 1254 comprise sixteen individual receivers arranged to be connected through the relays to the data I/O leads active in the DFT mode of each of the eight memory parts. With only sixteen receivers available to test the eight memory parts in DFT mode, the active data I/O leads in DFT mode on each part can number only one or two. This provides for all eight memory parts to be tested in the DFT mode at one time.

Figure 13:
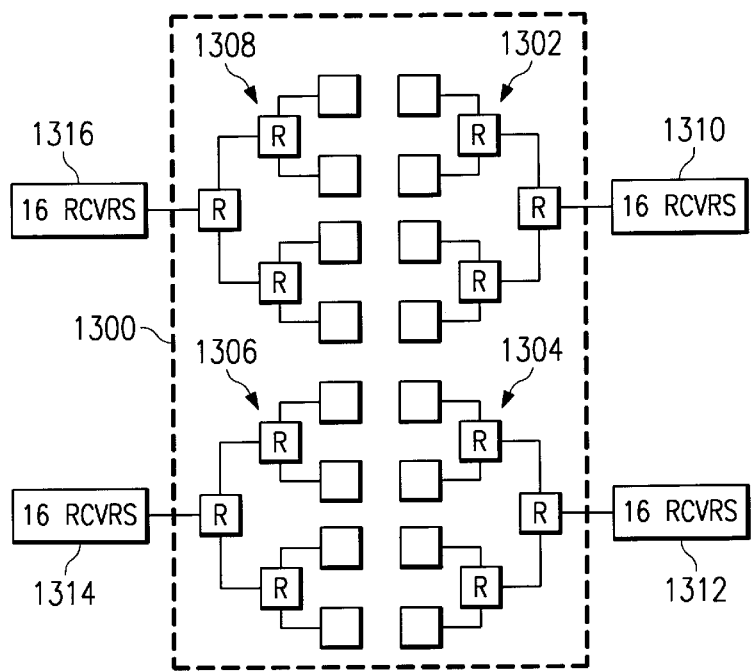
FIG. 13 is a block diagram of four modules of the two stage relay arrangement or module of FIG. 6 provided on one test performance board.

In FIG. 13, test performance board 1300 carries four modules, 1302, 1304, 1306 and 1308 of memory part sockets and two stage relay arrangements. Module 1302 of sockets and two stage relays connect to sixteen receivers 1310, module 1304 of sockets and two stage relays connect to sixteen receivers 1312, module 1306 of sockets and two stage relays connect to sixteen receivers 1314 and module 1308 of sockets and two stage relays connect to sixteen receivers 1316. Each module of sockets and two stage relay arrangements 1302, 1304, 1306 and 1308 corresponds to and is connected in the same manner described in connection with FIGS. 6, 7, 10 and 11. This arrangement would work with a testhead having sixty-four receivers.

The result of this disclosed invention is that old test equipment can be used and maximized for testing memory parts having wide words of such as sixteen data I/O lines per part. Old test equipment also can be used, with the disclosed invention, to test memory parts having wide word data I/O lines of even thirty-two data I/O lines per part.

The performance and test boards carry sockets and stages of relays to provide both DFT mode and non-DFT mode testing to occur within the same tester, handler and performance test board. Further there is no change in the present test operations throughout the manufacturing process.

The relays type can be as desired. A particular relay used in connection with this invention has been a double pole, single throw relay manufactured by the Coto Corporation of Providence, R.I. under part number 2900-0089/2300-5001. This is also known as a reed relay.

The sockets type on the test performance boards can be as desired. In particular, the sockets used with this invention have been made by Yamaichi under part number KS-8054. The test sockets preferably are the same as those previously used. The handler for loading and unloading the sockets is the same as has been previously used and is an Advantest model M3471.

The controller for supplying the five volts of voltage selectively to control the banks of relays is an IC chip driver operating under software control to either open or close the banks of relays. In one version the controller can be driven from the tester electronics using a TPIC6273 integrated circuit. In another version, the tester electronics can drive a buffered driver on the test performance board using an SN75468 integrated circuit.

The number of receivers in a tester varies as do the number of test heads per test system. The invention provides for varying the test performance boards to match the number of devices under test or memory parts being tested to make the most efficient use of the test system receivers.

A unique aspect of this invention is that both functional and parametric testing can be done independently for each device under test or memory part. The result of one memory part testing has no effect on the testing of another memory part on the test performance board.

The number of modules that can be constructed on a test performance board depends upon the total number of receivers available on the testhead receiving that test performance board. The main limitation to the number of devices under test that can be constructed on the test performance board is due to the physical limitation of the size of the board. This physical limitation results from requiring a minimum area on which to carry all of the devices under test and associated relays and there being some maximum area available on the testhead for mounting the test performance board.

The preferred arrangement generally depends on the configuration of the data I/O leads or lines on the memory parts. For example, a memory part having eight data I/O leads could have a preferred arrangement of modules, which have a single stage of relays and two devices under test, each connected to eight receivers. A memory part having sixteen data I/O leads could have a preferred arrangement of modules, which have two stages of relays and four devices under test.

The disclosed invention can be practiced in ways other than those specifically disclosed while remaining within the scope of the following claims.

The application may be practiced other than as specifically described. For example, the number of receivers and stages of relays can be selected as desired to test memory parts having different numbers of data I/O leads. Further, the data I/O leads active in the DFT mode can be different from the least significant data I/O leads, according to the design of the memory parts.

We claim:

1. A process of testing memory parts in a test machine having test receivers, the process comprising:
   A. providing memory parts, each memory part having plural data I/O leads, having a regular operating mode, in which all of the data I/O leads are active, and having a design for test mode, in which a certain number of the data I/O leads are active and the certain number is less than all of the data I/O leads;
   B. inserting the memory parts into a test fixture;
   C. selectively connecting the certain number of data I/O leads of all the memory parts mounted in the test fixture to the test receivers;
   D. testing at the same time the memory parts inserted in the test fixture in the design for test mode;
   E. selectively connecting all the data I/O leads of individual ones of the memory parts inserted in the test fixture, one memory part at a time, to the test receivers; and
   F. testing individual ones of the memory parts inserted in the test fixture in the regular operating mode.

2. The process of claim 1 in which the memory parts have sixteen data I/O leads all active in the regular operating mode and have four or two or one data I/O leads active in a design for test mode.

3. The process of claim 1 in which the selectively connecting steps include selectively connecting the data I/O leads of the memory parts to the receivers with relays.

4. The process of claim 1 in which the selectively connecting steps include selectively connecting the data I/O leads of the memory parts to the receivers with at least one stage of relays.

5. The process of claim 1 in which the selectively connecting steps include selectively connecting the data I/O leads of the memory parts to the receivers with plural stages of relays.

6. A process of testing memory parts in a test machine having test receivers, the process comprising:

A. providing memory parts, each memory part having binary multiples of data I/O leads, having a regular operating mode, in which all of the data I/O leads are active, and having a design for test mode, in which a certain number of the data I/O leads are active and the certain number is less than all of the data I/O leads;

B. inserting a binary multiple of the memory parts into a test fixture;

C. selectively connecting the certain number of data I/O leads of all the memory parts inserted in the test fixture to the test receivers by selectively opening and closing electrical connections between the data I/O leads and the receivers with relays;

D. testing at the same time all the binary multiple of memory parts inserted in the test fixture in the design for test mode;

E. selectively connecting all the data I/O leads of individual ones of the binary multiple of memory parts inserted in the test fixture, one memory part at a time, to the test receivers by selectively opening and closing electrical connections between the data I/O leads and the receivers with relays; and E. testing individual ones of the binary multiples of memory parts inserted in the text fixture in the regular operating mode.

7. A test performance board assembly for testing memory parts, each memory part having binary multiples of data I/O leads, having a regular operating mode, in which all of the data I/O leads are active, and having a design for test mode, in which a certain number of the data I/O leads are active and the certain number is less than all of the data I/O leads, the test performance board assembly comprising:

A. a substrate;

B. a binary multiple of memory part sockets carried on the substrate and having leads corresponding to the data I/O leads of the memory parts;

C. plural terminals formed on the substrate; and

D. a binary multiple of relays carried on the substrate and connected between the leads of the sockets and the terminals, the relays selectively connecting the leads of the sockets to the terminals by selectively opening and closing electrical connections between the leads of the sockets and the terminals, the relays being arranged to provide one set of connections between only the certain number of data I/O leads of all the sockets and the terminals and another set of connections between all of the data I/O leads of each socket and the terminals, one socket at a time.

8. The test performance board assembly of claim 7 in which each board carriers at least one module of four sockets, with sixteen data I/O leads per socket, and forty-eight relays selectively connecting the sixteen data I/O leads of each socket to sixteen receivers, the relays being arranged in two stages.

9. The test performance board assembly of claim 7 including test receivers connected to the terminals of the test performance board assembly, the test receivers being part of a test machine.

* * * * *